United States Patent
Burroughes et al.

(10) Patent No.: US 6,576,093 B1
(45) Date of Patent: Jun. 10, 2003

(54) METHOD OF PRODUCING ORGANIC LIGHT-EMITTING DEVICES

(75) Inventors: Jeremy Henley Burroughes, Cambridge (GB); Julian Charles Carter, Cambridge (GB); Stephen Karl Heeks, Cambridge (GB)

(73) Assignee: Cambridge Display Technology, Ltd., Cambridge (GB)

( * ) Notice: Subject to any disclaimer, the term of this patent is extended or adjusted under 35 U.S.C. 154(b) by 0 days.

(21) Appl. No.: 09/868,302

(22) PCT Filed: Dec. 15, 1999

(86) PCT No.: PCT/GB99/04154

§ 371 (c)(1),
(2), (4) Date: Sep. 24, 2001

(87) PCT Pub. No.: WO00/36663

PCT Pub. Date: Jun. 22, 2000

(30) Foreign Application Priority Data

Dec. 17, 1998 (GB) ................................................ 9827826
Dec. 17, 1998 (GB) ................................................ 9827828

(51) Int. Cl.$^7$ .......................... C23C 14/00; B05D 5/12; B05D 1/36
(52) U.S. Cl. .............................. 204/192.1; 204/298.23; 427/470; 427/58; 427/251; 427/255.7; 427/402; 427/404
(58) Field of Search .................... 118/719, 723 VE, 118/729, 730; 204/192.1, 298.23, 298.28, 298.25, 298.26; 427/470, 58, 402, 404, 255.7, 250, 251

(56) References Cited

U.S. PATENT DOCUMENTS 5,739,545 A  4/1998  Guha et al. .................... 257/40

FOREIGN PATENT DOCUMENTS

| JP | 10125472 | 5/1998 | ........... H05B/33/26 |
| JP | 10330917 | 12/1998 | ........... C23C/14/12 |
| WO | WO 97/33296 | 9/1997 | ............. H01J/1/62 |
| WO | WO 98/10473 | 3/1998 | ........... H01L/33/00 |

OTHER PUBLICATIONS

English translation of JP 10–330917.*

English translation of JP 10–125473.*

* cited by examiner

*Primary Examiner*—Steven H. VerSteeg
(74) *Attorney, Agent, or Firm*—Finnegan, Henderson, Farabow, Garrett & Dunner, LLP

(57) ABSTRACT

A method of reducing black spots in a light-emitting device comprising a light-emissive material interposed between a first electrode and a second electrode such that the first and second electrodes are capable of injecting charge carriers into the light-emissive organic material, the method comprising: forming at least one of the first and second electrodes by depositing onto the light-emissive organic material a first layer of a material by a deposition technique which intrinsically results in undesirable pin-holes; and depositing a second layer of a material onto the first layer by a conformable deposition technique.

19 Claims, 5 Drawing Sheets

METHOD OF PRODUCING ORGANIC LIGHT-EMITTING DEVICES

FIELD OF THE INVENTION

This invention relates to a method for producing organic light-emitting devices (OLEDs).

BACKGROUND OF THE INVENTION

Organic light-emitting devices such as described in U.S. Pat. No. 5,247,190 or in U.S. Pat. No. 4,539,507, the contents of which are incorporated herein by reference, have great potential for use in various display applications. According to one method, an OLED is fabricated by coating a glass or plastic substrate with a transparent first electrode (anode) such as indium tin oxide (ITO). At least one layer of a thin film of an electroluminescent organic material is then deposited prior to a final layer which is a film of a second electrode (cathode), typically a metal or alloy.

A typical cathode layer will comprise a layer of a low work function metal or an alloy containing at least one low work function metal.

Such a cathode layer is typically deposited by vacuum evaporation or by a sputtering technique such as rf sputtering or dc magnetron sputtering. When the underlying organic layer is a layer of a relatively sensitive material such as a soluble conjugated polymer, vacuum evaporation is often the preferred technique for depositing the first layer because it is a relatively low-energy process which causes less damage to the underlying layer of organic material.

It has been noticed by the inventors of the present invention that cathode layers deposited by conventional vacuum evaporation techniques contain pinholes, through which water and oxygen are able to enter the device and initiate reactions at the interface between the organic layer and the cathode layer. These reactions result in the formation of non-emitting black spots with a consequent degradation in device performance.

It is an aim of the present invention to provide a method for forming an electrode on a light-emissive organic material, which avoids or at least reduces the problems of the prior art.

It is an aim of the present invention to reduce black spots in an organic light-emitting device.

Vacuum evaporation and sputtering are the conventional techniques used for depositing a thin layer of a conductive material on to the electroluminescent layer to form the cathode. Vacuum evaporation is often the preferred technique (particularly where the organic material on to which the conductive material is to be deposited is a relatively sensitive material such as a soluble conjugated polymer) because it causes less damage to the underlying organic material than sputtering.

However, with conventional methods of vacuum evaporation, there has been the problem that the deposited film contains pinhole defects, as discussed in SID Digest F-28, 1997, Arjan Berntsen et al. Water and oxygen are able to enter the device via such pinholes in the evaporated cathode layer and initiate reactions at the interface between the organic layer and the cathode layer. These reactions result in the formation of non-emitting black spots with a consequent degradation in device performance.

It is an another aim of the present invention to provide a method for depositing a conductive layer on an organic substrate by evaporation, which avoids or at least reduces the problems of the prior art.

SUMMARY OF THE INVENTION

The inventors of the present invention found that the formation of a conformably deposited layer on top of a layer having undesirable pinholes has the effect of reducing black spots in the resulting light-emitting device.

According to a first aspect of the present invention, there is provided a method for reducing black spots in a light-emitting device comprising a light-emissive material interposed between a first electrode and a second electrode such that the first and second electrodes are capable of injecting charge carriers into the light-emissive organic material, the method comprising: forming at least one of the first and second electrodes by depositing onto the light-emissive organic material a first layer of material by a deposition technique which intrinsically results in undesirable pinholes; and depositing a second layer of material onto the layer of first material by a conformable deposition technique, such as a sputtering technique, which forms a layer over the whole surface of the target substrate, regardless of the existence of portions of the substrate which are not directly exposed to the deposition source.

In a preferred embodiment, the first layer, and preferably also the second layer, are made of materials which are capable of injecting negative charge carriers into the light-emissive organic material. The first layer is preferably comprised of a metal having a work function of 3.7 eV or less, preferably 3.2 eV or less, or an alloy containing such a low work function metal.

This will be particularly advantageous if both the first and second layers are composed of materials which are capable of injecting charge carriers (negative charge carriers in the case of a cathode) since substantially the entire surface of the light-emissive organic material underlying the respective electrode will be available for injection thereinto of the respective charge carriers.

According to a second aspect of the present invention, there is provided a method for forming an electrode on a substrate comprising a layer of organic material comprising the steps of: depositing one or more layers of conductive material onto the layer of organic material by a low energy technique such as a thermal evaporation technique to form an intermediate product; and depositing a layer onto the surface of the outermost low energy deposited layer of the intermediate product remote from the layer of organic material by a conformable deposition technique; wherein the outermost low energy deposited layer and the conformably deposited layer are deposited without exposing the intermediate product to any atmosphere other than those used to deposit the outermost low energy deposited layer and the conformably deposited layer.

The low energy technique can be any deposition technique that does not cause undue damage to the underlying organic layers, such as a thermal evaporation technique.

The outermost low energy deposited layer and the conformably deposited layer are preferably deposited in a single chamber.

In one embodiment of the second aspect of the present invention, the organic material is a light-emissive organic material, and the low energy deposited layer adjacent the light-emissive organic material is a layer of a metal having a low work function, preferably calcium. The conformably deposited layer may, for example, be a layer of a ductile metal such as aluminium to serve as a contact. Alternatively, the sputtered layer may be a layer of a dielectric material such as aluminium nitride to serve as a protective layer.

When more than one layer is deposited on the organic layer by a vacuum evaporation technique prior to the deposition of the conformably deposited layer, it is preferable that each such evaporated layer is deposited without breaking the vacuum between the deposition of each such evaporated layer, and further preferable that each such evaporated layer is deposited in the same chamber as the outermost evaporated layer and the conformably deposited layer.

RF sputtering or DC magnetron sputtering may, for example, be used as the conformable deposition technique. In the case that a layer of a metal or metal alloy is to be deposited by sputtering, the sputter target/cathode is made out of the metal or metal alloy and an inert gas such as argon or neon is used as the discharge gas. Neon is preferred to argon, because sputtering with neon causes less damage to the underlying organic layer via the pinholes existing in the evaporated layer upon which the sputtered layer is deposited.

According to a third aspect of the present invention, there is provided a use in the production of an organic light-emitting device of an evaporation technique comprising depositing a layer of material from an evaporation source onto a surface of a substrate by vacuum evaporation whilst moving the substrate so as to vary the angle of orientation of the surface of the substrate with respect to a fixed point of the evaporation source.

According to a fourth aspect of the present invention, there is provided a method of producing an organic light-emitting device comprising the steps of providing a layer of light-emissive organic material on a first electrode, and providing a second electrode on the layer of light-emissive organic material, wherein the formation of the second electrode comprises the step of depositing a layer of material from an evaporation source on to the surface of the layer of light-emissive organic material remote from the first electrode by evaporation whilst moving the layer of light-emissive organic material so as to vary the angle of orientation of the surface thereof with respect to a fixed point of the evaporation source.

According to a fifth aspect of the present invention, there is provided a method of depositing a substantially pinhole-free electrode layer onto a substrate comprising a light-emissive organic layer, said method comprising depositing the material of the electrode layer from an evaporation source onto a surface of the substrate by evaporation whilst moving the substrate so as to vary the angle of orientation of the surface of the substrate with respect to a fixed point of the evaporation source.

In another embodiment of the third to fifth aspects of the present invention, the substrate is also rotated about a second axis orthogonal to the first axis. In one embodiment, this second axis is orthogonal to the plane of the substrate. The rotation about each of the first and second axes is preferably carried out simultaneously.

The method according to the third to fifth aspects of the present invention is particularly applicable to the deposition of a conductive layer directly on the light-emissive organic layer. It is also equally applicable, for example, to the deposition of a second conductive layer on the surface of a first conductive layer which has been deposited on the light-emissive organic layer by, for example, a conventional vacuum evaporation method or by the method of the present invention.

BRIEF DESCRIPTION OF THE DRAWINGS

Hereunder, preferred embodiments of the present invention will be described, by way of example only, with reference to the accompanying drawings in which.

DESCRIPTION OF THE PREFERRED EMBODIMENTS

Figure 1:
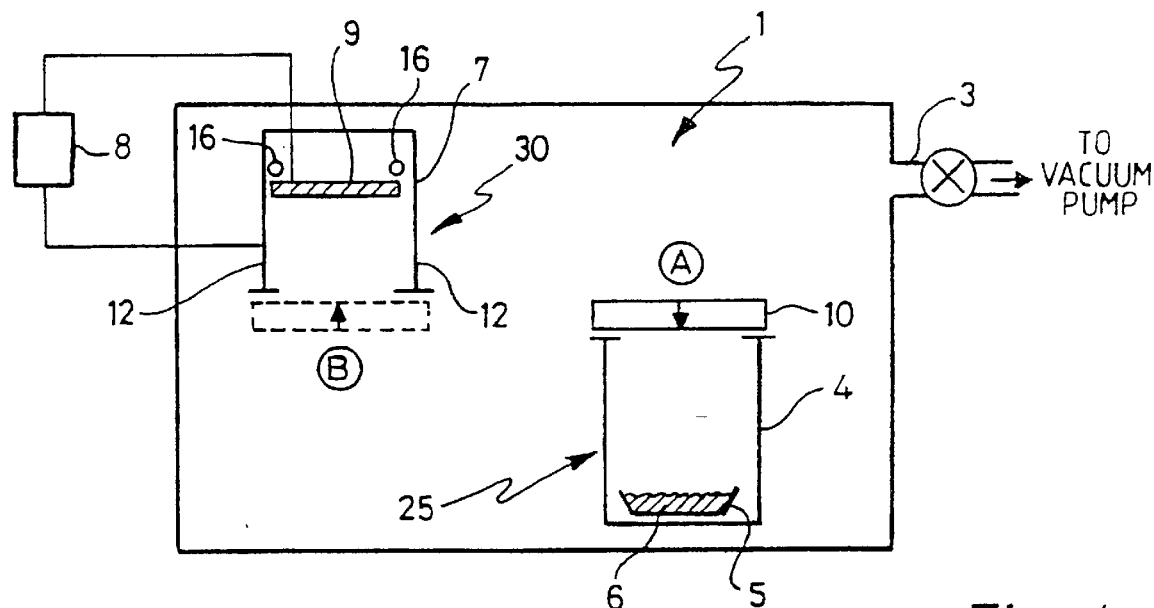
FIG. 1 is a schematic view of apparatus for carrying out a method according to an embodiment of the first and second aspects of the present invention.

With reference to FIG. 1, a single vacuum chamber 1 is provided which can be evacuated by means of a cyropump via outlet 3. The vacuum chamber 1 houses both an evaporation station 25 and a sputtering station 30. A substrate holder 10 is also provided in the vacuum chamber 1. The substrate holder 10 can be moved between a position A above the evaporation station 25 (as shown in solid lines) and a position B below the sputtering station 30 (as shown in dotted lines). The substrate holder is moveable such that the open side thereof (through which the surface of the substrate is exposed and shown by the arrow in FIG. 1) faces downwards when it is adjacent the evaporation station 25 and faces upwards when it is adjacent the sputtering station 30. The sputtering station may equally be arranged horizontally with the target facing sideways (i.e. generally orthogonal to the vertical), in which case the substrate holder is accordingly moved into a position in which the open side thereof faces sideways (i.e. generally orthogonal to the vertical) to directly face the target when it is adjacent the sputtering station.

The evaporation station 25 comprises a housing 4 in the base of which is located an evaporation boat 5 containing a source of the material 6 to be deposited by evaporation.

the sputtering station 30 comprises a dc magnetron sputtering device comprising a housing 7 whose rear surface supports a sputter cathode/target 9.

Figure 2:
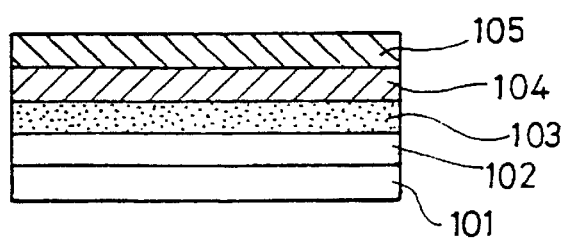
FIG. 2 is a cross-sectional view of an organic light-emitting device produced using a method according to an embodiment of the first and second aspects of the present invention.

The method of the present invention shall now be described in detail with reference, by way of example, to the production of the organic light-emitting device shown in FIG. 2 comprising a glass base 101, an indium tin oxide (ITO) layer 102 deposited on the glass base 101, an organic PPV layer 103 deposited on the ITO layer 102, a thin calcium layer 104 deposited on the organic PPV layer 103 and an aluminium capping layer 105 on the thin calcium layer 104.

A partially formed OLED, comprising a glass base, a layer of indium tin oxide (ITO) deposited on the glass base, and an organic PPV layer deposited on the ITO layer, is mounted in the substrate holder such that the outer surface of the organic PPV layer is exposed. The substrate holder is then moved into position A in which the exposed surface of the organic PPV layer faces the source material i.e. calcium metal in the evaporation boat 5. The vacuum chamber is evacuated by means of the cryopump down to $10^{-8}$ mb.

The evaporation boat is heated until the calcium metal in the evaporation boat is vaporized such that calcium atoms are evaporated and condense on the exposed surface of the organic PPV layer. The calcium metal in the evaporation boat 2 can be heated by, for example, resistance heating.

When resistance heating is employed, the evaporation boat must be made of a material that has a melting point very much higher than that of the metal to be evaporated. Tungsten or molybdenum are suitable materials. According to one variation, a coil of wire coated with the material to be evaporated can be used instead of the evaporation boat.

Figure 3:
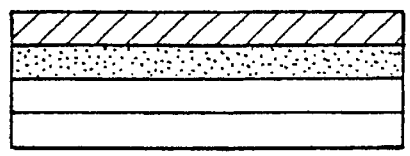
FIG. 3 is a cross-sectional view of the intermediate product obtained prior to sputtering in an embodiment of a method according to the first and second aspects of the present invention.

A 200 nm layer of calcium is thus deposited on the organic PPV layer to obtain the intermediate product shown in FIG. 3. The substrate holder holding the intermediate product is then moved into position B where the outer surface of the newly formed calcium layer of the intermediate product faces the sputter target/cathode 9 made of aluminium in the sputtering station 30.

Neon is introduced into the vacuum chamber via the manifold tubes 16 to act as the discharge gas for the sputter deposition step. To begin the sputtering process the voltage is applied to the cathode relative to the housing and material is then sputtered from the target to the substrate to deposit a layer of aluminium having a thickness of 10 microns on the surface of the calcium layer. Process parameters of the sputtering process are as follows:

process pressure: $5 \times 10^{-3}$ mb, power density: 3 W/cm$^2$, flow rate of neon: 25 sccm, deposition time: 180 s target-substrate distance: 75 mm Sputtering with neon results in slower deposition than with argon. Therefore, it is important to control the amount of residuals in the vacuum chamber. Ideally, the residual pressure should be less than $10^{-10}$ mb. This can be achieved by creating a low base pressure (with a powerful pump and good seals for the chamber) and/or by forming a low-residual micro-environment at the sputtering site by (for example) using extended side plates 12 to limit conductance routes for residuals and whose surfaces act as a getter pump.

The use of neon as the discharge gas provides significant advantages because the sputter process using neon can cause significantly less disruption to the underlying organic layer exposed via intrinsic pinholes in the first evaporated layer than when argon is used.

The switch between evaporation and sputtering is continuous in that the product of the evaporation step (i.e. the intermediate product shown in FIG. 3) is not exposed to any other atmosphere other than the atmosphere of neon gas used to deposit the subsequent aluminium layer by sputtering. In other words, the vacuum is not broken prior to the introduction of the discharge gas for sputtering. This has the advantage that the possibility of reactive species such as moisture or oxygen penetrating the pinholes existing in the evaporated layer and initiating reactions at the interface between the organic layer and the evaporated layer before the pinholes are filled by sputtering the aluminium layer on top of the evaporated layer is reduced.

The apparatus may be modified to include, for example, additional evaporation stations, whereby a plurality of evaporated layers of different materials could be deposited onto the organic PPV layer prior to the deposition of a sputtered layer without breaking the vacuum between the deposition of each layer.

For example, a second evaporation station may be provided to deposit an intermediate layer of aluminium having a thickness of about 1 micron prior to the deposition of the sputtered aluminium layer.

The description above relates to the application of a method according to first and second aspects of the present invention to the formation of a multilayer cathode. However, the method of the first and second aspects of the present invention can equally be applied to the formation of a multilayer anode, such as in the case when an organic light-emitting device is produced by first forming a cathode on a glass substrate, depositing the light-emissive organic layer(s) on the cathode, and finally forming an anode on the light-emissive organic layer(s).

The application of a method according to the third to fifth aspects of the present invention to the deposition of a cathode layer for a light-emitting device comprising a glass base, an ITO layer (as the anode), a light-emissive organic layer and a cathode will now be described by way of example only.

Figure 4:
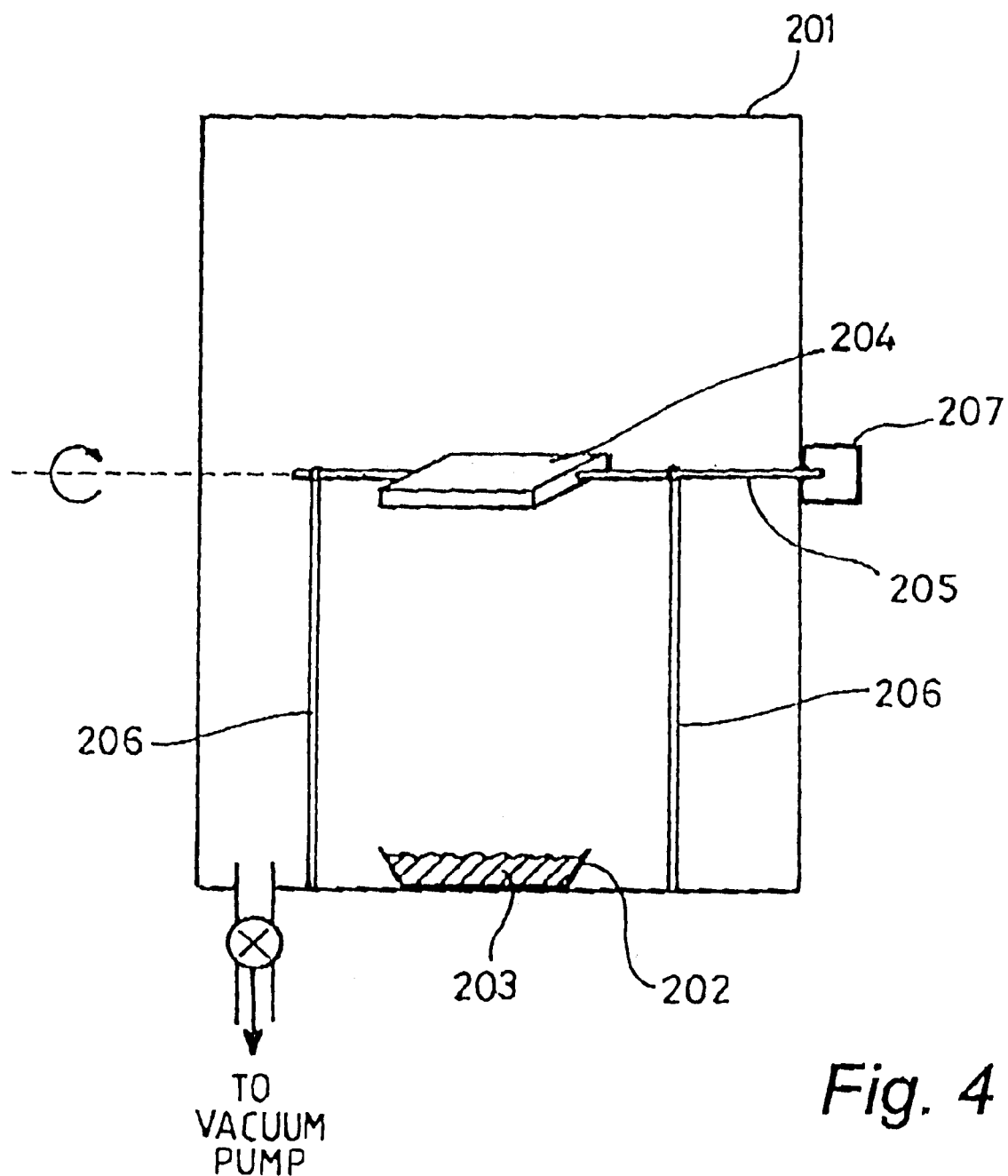
FIG. 4 is a schematic view of apparatus for carrying out an embodiment of a method according to the third to fifth aspects of the present invention.

With reference to FIG. 4, an evaporation chamber 201 is provided with an evaporation boat 202 containing the source material 203. A substrate holder 204 is mounted on a horizontal shaft 205. The horizontal shaft is mounted on a pair of vertical supports 206 in such a manner that the horizontal shaft 205 can freely rotate about its axis. One end of the horizontal shaft 205 is connected to an actuator 207, which is located outside the evaporation chamber 201. The actuator 207 functions to rotate the horizontal shaft 205 about its own axis whereby the substrate holder 204 is also rotated about the axis of the horizontal shaft 205.

A substrate comprising a glass base, an ITO layer on the glass base and a light-emissive organic layer deposited on the ITO layer is mounted on the substrate holder such that only the outermost surface of the organic layer is exposed and facing the evaporation boat containing the source material.

The source material is used to form a cathode layer and can, for example, be a metallic element or alloy with a work function of typically less than or around 3.5 eV or preferably even less than or round 3 eV. Examples are Ca, Ba, Li, Sm, Yb, Th etc. or alloys of Al, Ag or others with low work function elements such as Ca, Ba, Li, Sm, Yb, Th etc. Calcium is particularly preferred.

The evaporation chamber 201 is then evacuated via a vacuum pump (not shown in FIG. 4), and the evaporation boat is heated until the source material is vaporized whence atoms are evaporated and condense on the exposed surface of the organic layer.

At the same time, the actuator 207 is operated to rotate the horizontal shaft 205 about its own axis whereby the substrate holder 204 is also rotated about the same axis. The nature of the rotation is shown in FIGS. 5a to 5e which show the position of the substrate holder from a view taken down the axis of the horizontal shaft 205.

Figure 5A:
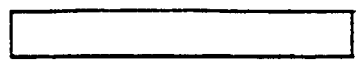
FIGS. 5a to 5e are schematic views of a substrate holder at various stages of rotation in an embodiment of a method according to the third to fifth aspects of the present invention.
Figure 5B:
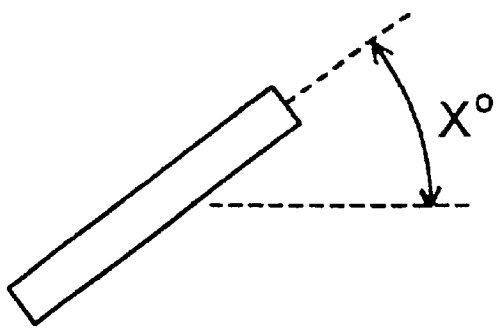

With reference to FIG. 5b, the actuator is first operated to rotate the substrate holder in a first direction by a fixed angle X degrees from its starting position shown in FIG. 5a.

Figure 5C:
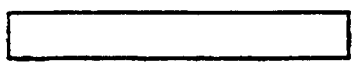
Figure 5D:
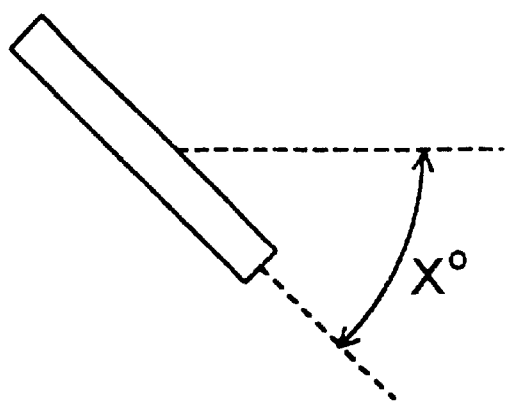
Figure 5E:
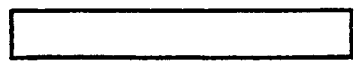

The actuator is then operated to rotate the substrate holder by X degrees in the opposite direction to bring it back to the starting position as shown in FIG. 5c and then by a further X degrees to bring it to the position shown in FIG. 5d. The actuator is then operated to rotate the substrate holder by X degrees in the first direction to bring it back to its starting position as shown in FIG. 5e.

This sequence of operations is carried out continuously until the evaporation deposition is completed. The operation of the actuator is preferably controlled automatically by a control unit (not shown in the Figures).

The source material in the evaporation boat 202 can be heated by, for example, resistance heating, or alternatively by electron bombardment heating.

When resistance heating is employed, the evaporation boat must be made of a material that has a melting point very much higher than that of the metal being evaporated. Tungsten or molybdenum are suitable materials. According to one variation, a coil of wire coated with the material-to be evaporated can be used instead of the evaporation boat.

Another technique of vaporizing the source material is electron beam evaporation. In this technique, a focussed electron beam of high intensity is used to vaporize the source material. This technique is advantageous in that a layer of very high purity can be deposited on the substrate, and in that a much wider range of materials can be evaporated in this way. However, the light-emissive organic materials currently used in OLEDs are relatively sensitive materials, and this high energy technique does have the drawback that when depositing directly on such a layer of light-emissive organic material it can cause damage to the organic layer.

The substrate holder can be constructed for the mounting of a single substrate or for the mounting of a plurality of substrates.

In the apparatus shown in FIG. 4, the substrate holder is only mounted for rotation abut an axis parallel to the plane of the organic layer onto which the layer of conductive material is to be deposited.

Figure 6:
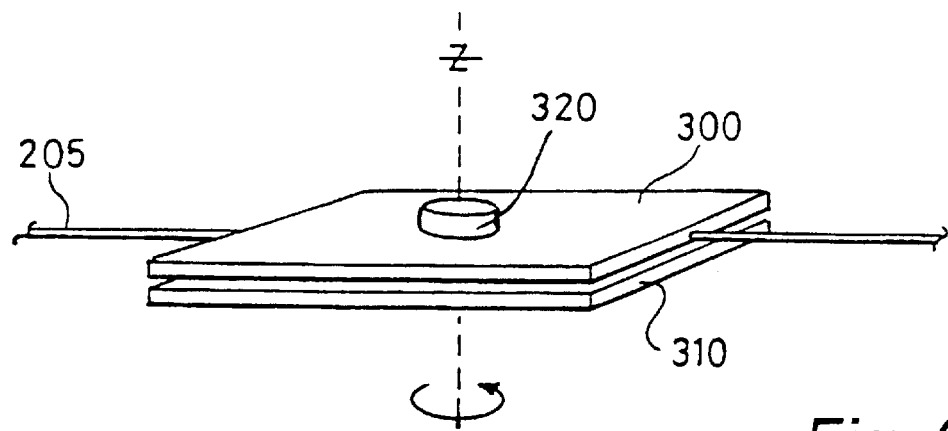
FIG. 6 is a schematic view of a substrate holder for carrying out another embodiment of a method according to the third to fifth aspects of the present invention.

According to one preferred variation, the substrate holder shown in FIG. 4 is replaced by a substrate holder of the kind shown in FIG. 6. A support 300 is fixed to the horizontal shaft 205 and a substrate holder 310 is mounted on the support 300 for rotation about a central axis Z running orthogonal to the plane of the substrate holder 310. Another actuator 320 is arranged on the rear of the support 300 for driving the rotation of the substrate holder 310 about this axis Z via a drive shaft (not shown in the Figure) which is connected to the substrate holder 310 via a hole in the support 300.

The actuators 207, 320 are preferably operated for simultaneous rotation of the horizontal shaft 205 about its own axis (with consequent corresponding rotation of the support 300 and substrate holder 310) and rotation of the substrate holder 310 about axis Z.

Figure 7:
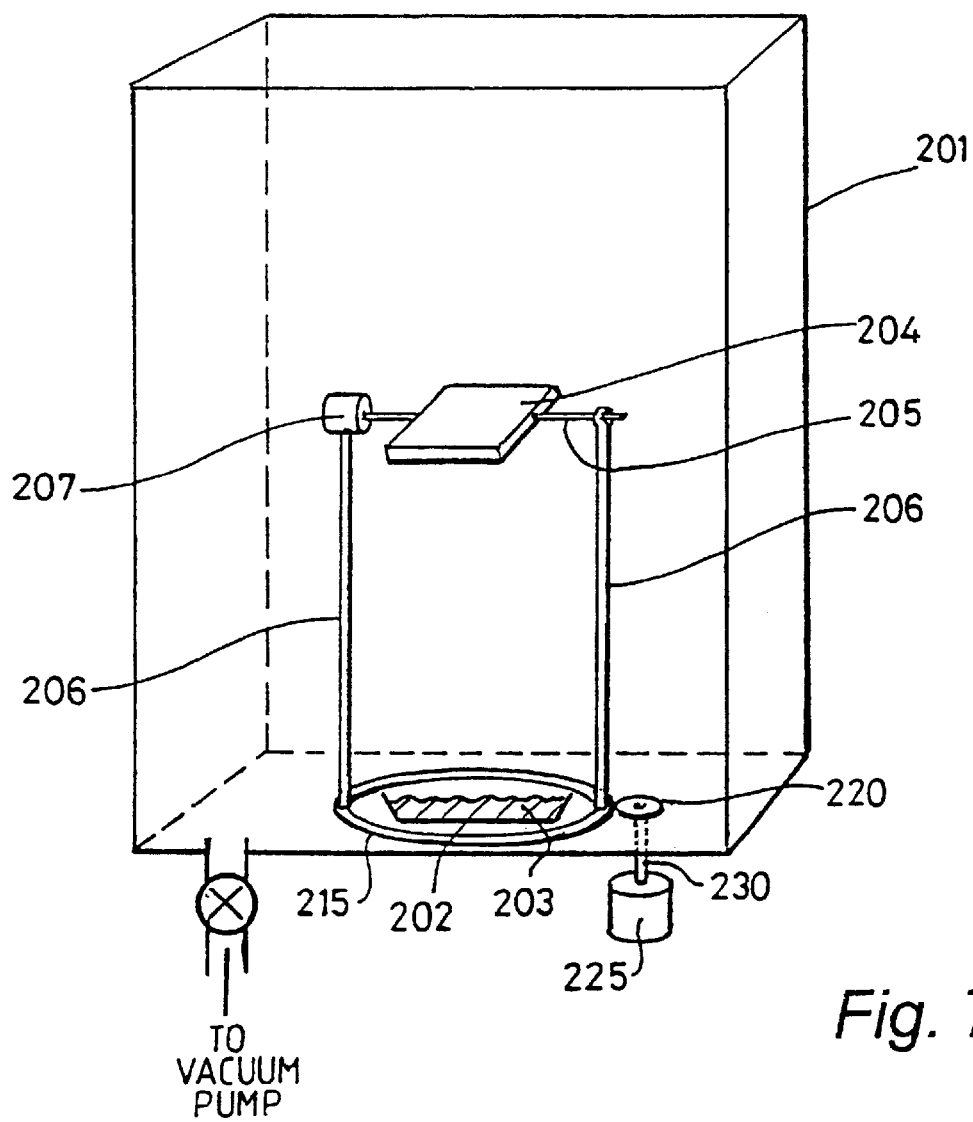
FIG. 7 is a schematic view of apparatus for carrying out another embodiment of a method according to the third to fifth aspects of the present invention.

Yet another variation of the method of the third to fifth aspects of the present invention employs the apparatus shown in FIG. 7. The vertical supports 206 are mounted on an annular base 215 which is itself mounted on the floor of the evaporation chamber 201 for rotation about its central axis. This can be done, for example, by means of a gearing system in which a small drive gear 220 is mounted for rotation on the floor of the evaporation chamber in a position where its teeth (not shown in FIG. 7) engage with teeth (not shown in FIG. 7) formed on the outer circumference of the annular base 215. A second actuator 225, which is located outside the evaporation chamber, is used to drive the rotation of the drive gear wheel via a vertical shaft 230, whereby the annular base 215 is rotated about its central axis.

The simple substrate holder shown in FIG. 7 may be replaced with the substrate holder shown in FIG. 6.

As shown in FIG. 7, the actuator 207, which is used to drive the rotation of the horizontal shaft 205 about its own axis, is brought inside the evaporation chamber and mounted at the top of one of the vertical supports 206.

The rotation of the horizontal shaft 205 about its own axis and the rotation of the annular base 215 about its central axis are preferably carried out simultaneously.

It is thought that the method according to the third to fifth aspects of the present invention works to reduce the number and size of pinholes by the following mechanism, although there is no intention to limit the scope of the present invention thereby.

Figure 8A:
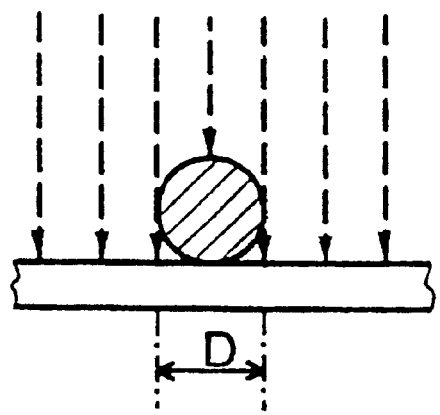
FIGS. 8a to 8c are enlarged cross-sectional views of the surface of an organic layer subject to vacuum evaporation deposition for explaining the effect of the method according to the third to fifth aspects of the present invention.

It is thought that the formation of pinholes in evaporated layers deposited on organic layers arises from the existence of relatively large particles on the surface of the organic layer. These particles may be agglomerates of the organic material itself or alien particles. The effect of these large particles is explained with reference to FIG. 8a which shows an enlarged cross-sectional view of a portion of an organic layer with such a relatively large particle located on its surface. Vacuum evaporation is a line-of-sight technique, and if the surface of the organic layer is maintained in a fixed position with respect to the source of the material to be deposited by vacuum evaporation, there are portions (having a size D shown in FIG. 8a) of the surface of the organic layer which lie in the shadow of the relatively large particle and are thus not exposed to the path of the evaporated particles. It is thought to be these areas which remain uncovered and form the undesirable pinholes.

Figure 8B:
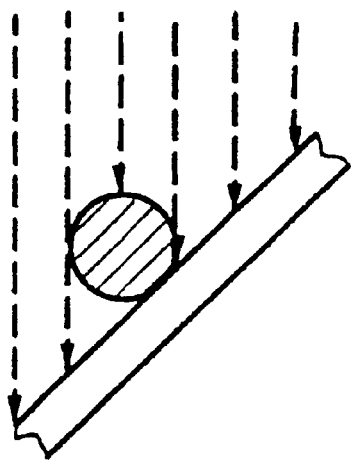
Figure 8C:
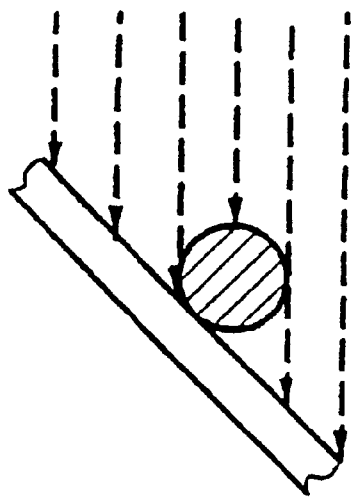

In the method according to the third to fifth aspects of the present invention, the angle of the surface of the organic layer is varied by, for example, rotation of the surface about an axis parallel to the plane thereof whereby the surface of the organic layer becomes inclined with respect to the flight path of the evaporated particles. With reference to FIGS. 8b and 8c, this has the result that at least a portion of the area of the surface which lies in the shadow of the relatively large particle when the organic layer is maintained in a fixed position becomes exposed to the path of the evaporated particles. Therefore, by varying the angle of the surface of the organic layer by, for example, rotating the organic layer about an axis parallel to the plane thereof, the area of the surface of the organic layer which is not exposed to the path of the evaporated particles is at least reduced resulting in at least smaller pinholes.

Although the formation of a cathode layer has been described above as an example of the method according to the third to fifth aspects of the present invention, the method can equally be applied to the formation of an anode layer, such as in the case when an organic light-emitting device is produced by first forming the cathode on a glass substrate, depositing the light-emissive organic layer(s) on the cathode, and finally forming an anode on the organic layer(s).

What is claimed is:

1. A method of producing an organic light-emitting device comprising the steps of providing a layer of light-emissive organic material on a first electrode, and providing a second electrode on the layer of light-emissive organic material, wherein the formation of the second electrode comprises the step of depositing a layer of material from an evaporation source onto the surface of the layer of light-emissive organic material remote from the first electrode by evaporation while moving the layer of light-emissive organic material so as to vary the angle of orientation of said surface of the layer of light-emissive organic material with respect to a fixed point of the evaporation source.

2. Use in the production of an organic light-emitting device of an evaporation technique comprising depositing a layer of material from an evaporation source onto a surface of a substrate by vacuum evaporation while moving the substrate so as to vary the angle of orientation of the surface of the substrate with respect to a fixed point of the evaporation source.

3. Use according to claim 2 wherein the substrate is rotated about a first axis parallel to the plane of the substrate.

4. Use according to claim 3 wherein the substrate is further rotated about a second axis orthogonal to the first axis.

5. Use according to claim 4 wherein the second axis is orthogonal to the plane of the substrate.

6. Use according to claim 4 wherein the second axis is also parallel to the plane of the substrate.

7. Use according to claim 4 wherein the rotation about the first and second axes is carried out simultaneously.

8. A method for forming an electrode on a substrate comprising a layer of organic material comprising the steps of: depositing one or more layers of a conductive material onto the layer of organic material by a low energy deposition technique to form an intermediate product; and depositing by a conformable technique a layer onto the surface of the outermost low energy deposited layer of the intermediate product remote from the layer of organic material; wherein the outermost low energy deposited layer and the conformably deposited layer are deposited in a single chamber without exposing the intermediate product to any atmosphere other than those used to deposit the outermost low energy deposited layer and the conformably deposited layer.

9. A method for forming an electrode according to claim 8 wherein the low energy deposition technique is a thermal evaporation technique.

10. A method for forming an electrode according to claim 8 wherein the conformable deposition technique is a sputtering technique.

11. A method for forming an electrode according to claim 8 wherein the intermediate product comprises a single layer of a low work function conductive material on the layer of organic material.

12. A method for forming an electrode according to claim 11 wherein the single layer of a low work function conductive material is a layer of calcium having a thickness of 200 nm or less.

13. A method for forming an electrode according to claim 8 wherein the intermediate product comprises a layer of a low work function conductive material on the layer of organic material, and a layer of a ductile metal on the surface of the layer of low work function conductive material remote from the layer of organic material.

14. A method for forming an electrode according to claim 13 wherein the layer of low work function conductive material is a layer of calcium having a thickness of 200 nm or less, and the layer of ductile metal is a layer of aluminum having a thickness of about 1 micron.

15. A method for forming an electrode according to claim 13 wherein the layer of a low work function conductive material and the layer of a ductile metal are deposited by vacuum evaporation without breaking the vacuum.

16. A method of forming an electrode according to claim 8 wherein the layer of organic material is a layer of light-emissive organic material.

17. A method of forming an electrode according to claim 8 wherein the intermediate product comprises two or more low energy deposited layers on the layer of organic material, and each low energy deposited layer is deposited without breaking a vacuum.

18. A method for forming an electrode according to claim 8 wherein the conformably deposited layer is a layer of aluminum having a thickness of between 0.01 and 10 microns.

19. A method of depositing a substantially pinhole-free electrode layer onto a substrate comprising a light-emissive organic layer, said method comprising depositing the material of an electrode layer from an evaporation source onto the substrate by evaporation while moving the substrate so as to vary the angle of orientation of the substrate with respect to a fixed point of the evaporation source.

* * * * *

UNITED STATES PATENT AND TRADEMARK OFFICE
CERTIFICATE OF CORRECTION

PATENT NO.   : 6,576,093 B1
DATED        : June 10, 2003
INVENTOR(S)  : Burroughes et al.

It is certified that error appears in the above-identified patent and that said Letters Patent is hereby corrected as shown below:

Column 9,
Line 21, "of a conductive" should read -- of conductive --.

Signed and Sealed this

Fourteenth Day of October, 2003

JAMES E. ROGAN
*Director of the United States Patent and Trademark Office*